United States Patent [19]
Boleda et al.

[11] 4,041,484
[45] Aug. 9, 1977

[54] ANALOG-TO-DIGITAL CONVERTER USING COMMON CIRCUITRY FOR SAMPLE-AND-HOLD AND INTEGRATING FUNCTIONS

[75] Inventors: Alberto Boleda, Menlo Park; Robert J. Tracey, San Mateo, both of Calif.

[73] Assignee: GTE Automatic Electric Laboratories Incorporated, Northlake, Ill.

[21] Appl. No.: 556,048

[22] Filed: Mar. 6, 1975

[51] Int. Cl.² ............................................. H03K 13/02
[52] U.S. Cl. ..................... 340/347 NT; 340/347 AD; 340/347 M; 324/99 D
[58] Field of Search ................ 340/347 AD, 347 NT, 340/347 SH; 324/99 D; 328/32, 151

[56] References Cited
U.S. PATENT DOCUMENTS

| | | | |
|---|---|---|---|
| 2,941,196 | 6/1960 | Raynsford et al. | 340/347 NT |
| 3,368,149 | 2/1968 | Wasserman | 340/347 NT |
| 3,390,354 | 6/1968 | Munch | 340/347 NT |
| 3,480,948 | 11/1969 | Lord | 340/347 AD |
| 3,487,304 | 12/1969 | Kennedy | 340/347 DA |
| 3,541,446 | 11/1970 | Prozeller | 340/347 NT |
| 3,668,691 | 6/1972 | Sergo | 340/347 AD |
| 3,815,032 | 6/1974 | Parker et al. | 328/151 X |

OTHER PUBLICATIONS
Analog Devices, Inc., "Analog-Digital Conversion Handbook," June 1972, pp. I-33, I-34, I-42, I-43, I-44, I-45, III-80 to III-85.

*Primary Examiner*—Thomas J. Sloyan
*Attorney, Agent, or Firm*—Leonard R. Cool; Russell A. Cannon

[57] ABSTRACT

An analog-to-digital converter employing a sample-hold, ramp generator and comparator in the conversion process combines the sample-hold and integrate functions in one operational amplifier. Provision may be made to derive the reference voltage, for the ramp generator, from the analog signal whereby automatic gain control is also obtained.

2 Claims, 5 Drawing Figures

ANALOG-TO-DIGITAL CONVERTER USING COMMON CIRCUITRY FOR SAMPLE-AND-HOLD AND INTEGRATING FUNCTIONS

BACKGROUND OF THE INVENTION

1. Field of the Invention

The invention relates to analog-to-digital converters and more particularly to such converters wherein the sample-hold and integrate functions are performed by a common circuit arrangement. The converter is applicable to bipolar signals. Further, a technique for automatic gain control is effected when the reference voltage is derived from the input signal.

2. Description of the Prior Art

Analog-to-digital converters have been used extensively in pulse code modulation communication systems to convert continuous time-varying information signals such as, for example, speech signals into a series of on/off pulses. One such encoder is that disclosed in U.S. Pat. No. 3,668,691. FIG. 1 of the subject patent is exemplary and shows separate circuit arrangements for the sample-and-hold, ramp generator and comparator circuits.

Reference may be made to the article, "An Electronic Design Practical Guide to A/D Conversion", Part 2, by Hermann Schmid, Electronic Design, vol. 16, no. 26, Dec. 19, 1968, at pp. 57 – 76. In particular, the discussion on single ramp comparison A/D converters beginning at pp. 58 is exemplary of the prior-art techniques. It should be noted that the discussion assumes some form of sample-and-hold circuit to hold the unknown voltage $V_x$ for comparison with the ramp generator output.

SUMMARY OF THE INVENTION

An analog-to-digital converter having a combined sample-hold integrate circuit arrangement for use in sampling time-varying signals and converting each sample into a digital word representative of the amplitude of the sample. The reference voltage may be derived from the time-varying signal.

DESCRIPTION OF THE PREFERRED EMBODIMENTS

Figure 1:
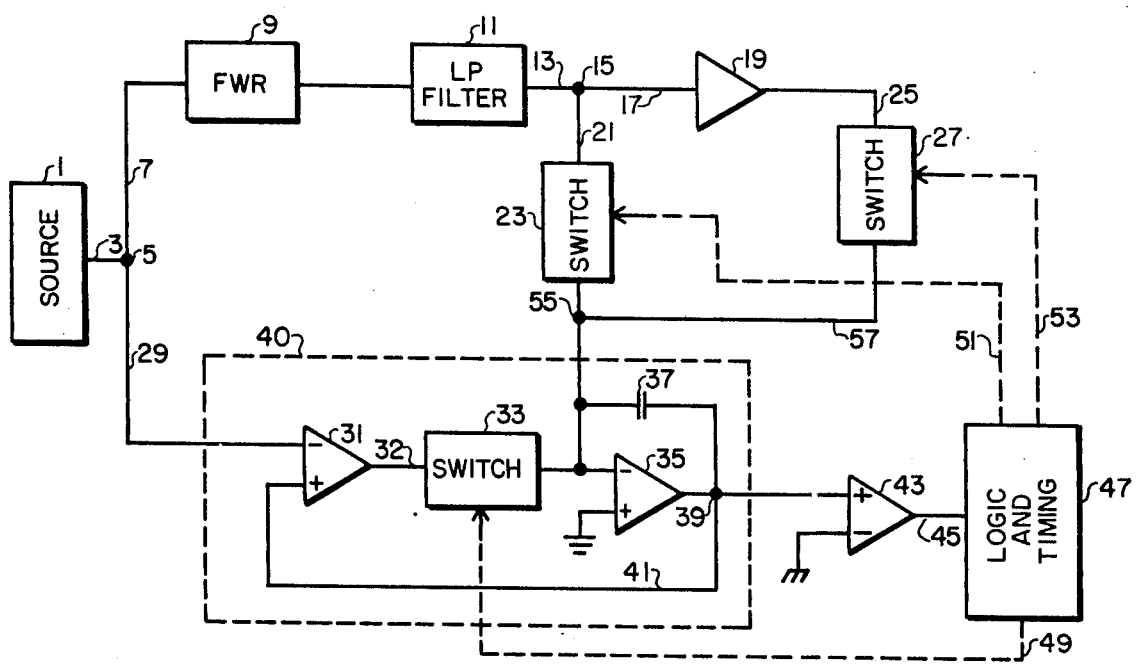
FIG. 1 is an elementary block diagram showing the circuit arrangement for deriving the positive and negative reference voltages from a time-varying input signal, for sampling and holding signal amplitudes and for converting the samples into digital words.

Referring to FIG. 1, source 1 provides a time-varying output voltage along lead 3. Source 1 can be a voice-frequency circuit or it may be the output from a data signal receiver which has a bipolar signal characteristic or any other time-varying function, and it may be unipolar as well as bipolar in nature. The signal to be sampled appears at junction 5 and then is applied via lead 7 to the reference voltage circuitry comprising full-wave rectifier 9, lowpass filter 11, inverter 19, and switches 23 and 27. The signal is simultaneously applied via lead 29 to the conversion circuitry comprising sample-and-hold and integrate circuit 40, comparator 43, and logic and timing circuit 47. By deriving the reference voltage from full-wave rectifier 9, lowpass filter 11, and inverter 19 as illustrated in FIG. 1, a forward-acting AGC is obtained. This reference voltage, whether positive or negative, is used to generate the ramp when the converter is in its conversion mode. Such a derived reference voltage is not fixed but, in fact, follows the variation in average signal level. Thus, variations which may occur in the transmission of the signal over a period of time will be compensated for by the use of this technique. The reference voltage may be obtained from a fixed d-c source, not shown, as is well known. When such a source is used, no AGC is obtained; however, the sample-hold and integrate circuit will function as described below.

Figure 2:
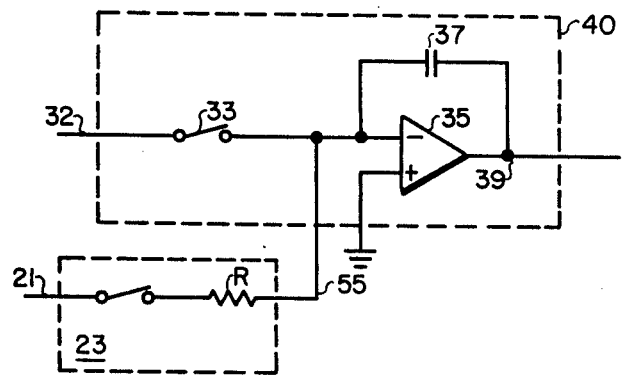
FIG. 2 is an elementary schematic diagram which shows the common circuitry used for the sample-and-hold and integrating functions FIG. 3 graphically illustrates the track, hold, and convert operating modes of the A/D converter of the invention.

Operation of the sample-hold and integrate circuit is explained by reference to FIG. 2. It should be noted that the reference numbers used correspond to those used for leads or circuit elements in FIG. 1 for reasons of clarity. In FIG. 2, the input signal appears on lead 32 and is applied through a switch 33 to the inverting input of operational amplifier 35. The reference voltage, and only one is shown in this example, is applied from lead 21 through switching circuit 23, which includes resistor R, to the inverting input of amplifier 35. In operation, when switch 33 is closed, the sample-hold and integrate circuit follows, i.e., tracks the input signal (the voltage across capacitor 37 follows the input signal on a one-to-one basis). This will be referred to hereinafter as the "track mode" and is graphically illustrated in FIG. 3. When switch 33 is opened, capacitor 37 will hold the voltage of the instantaneous sample. This will be referred to as the "hold mode". If now the reference potential is applied by closing switch 23, the sample-and-hold circuit is transformed into a ramp generator and is used in this manner to convert the analog signal to a digital waveform. This is called the "convert mode".

Figure 4:
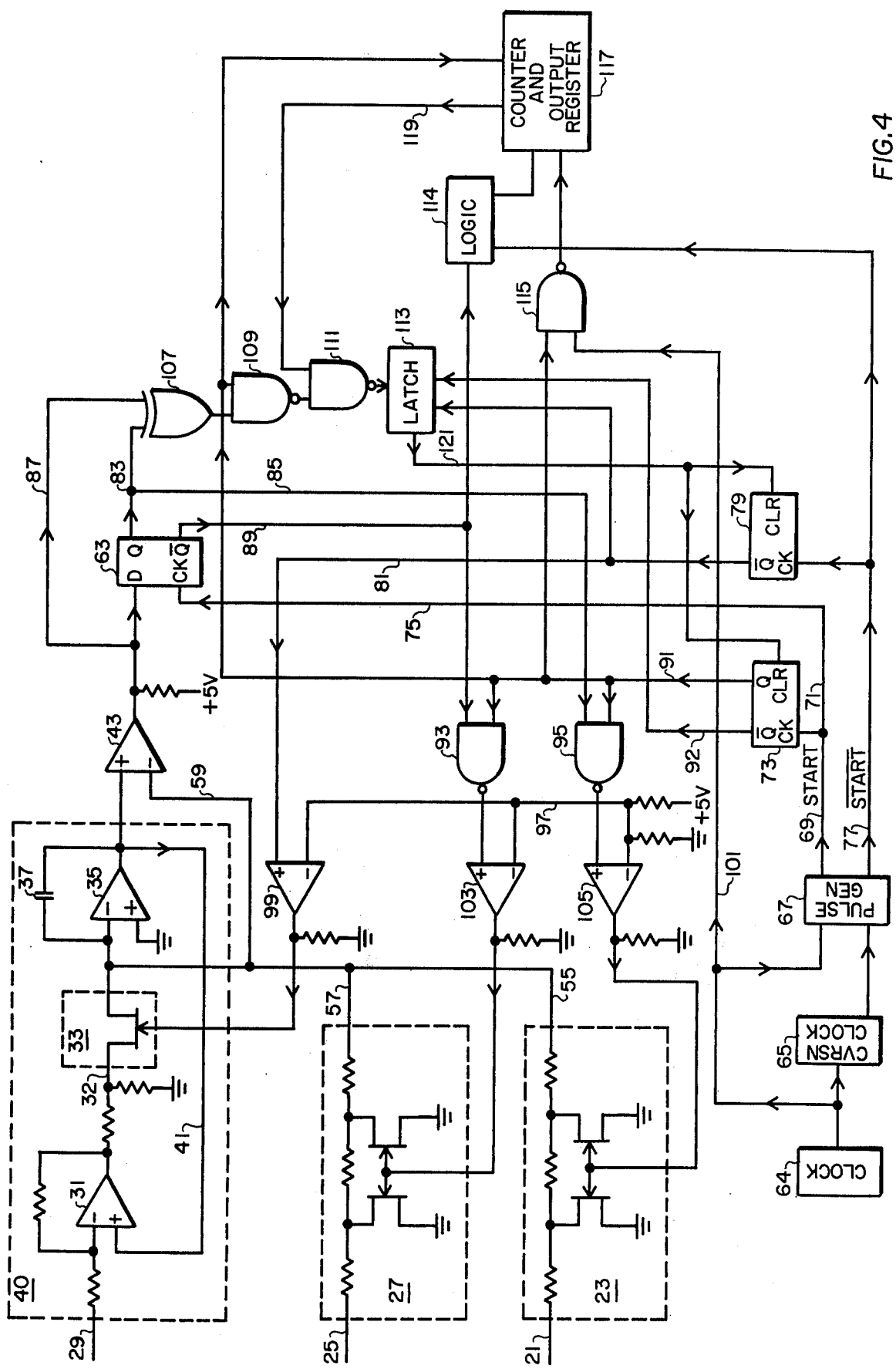
FIG. 4 is a detailed schematic diagram which illustrates the use of the reference voltages derived from the input signal and the use of the common circuitry for sample-and-hold and integrating functions in the A/D conversion process.

Referring again to FIG. 1, the A/D conversion circuitry included in block 40 is illustrated in FIG. 4 in more detail. Where possible, the common numbering arrangement for leads and circuit elements is again used for purposes of clarity. The source 1 and the means for deriving the reference voltage is not shown. With respect to the source 1, only lead 29 illustrates the connection to the source from the conversion circuitry. With respect to the reference voltages, leads 21 and 25 illustate the interconnection between switches 23 and 27 and the reference voltage generation circuitry. Further, FIG. 4 includes additional circuit elements necessary to the conversion process.

Figure 5:
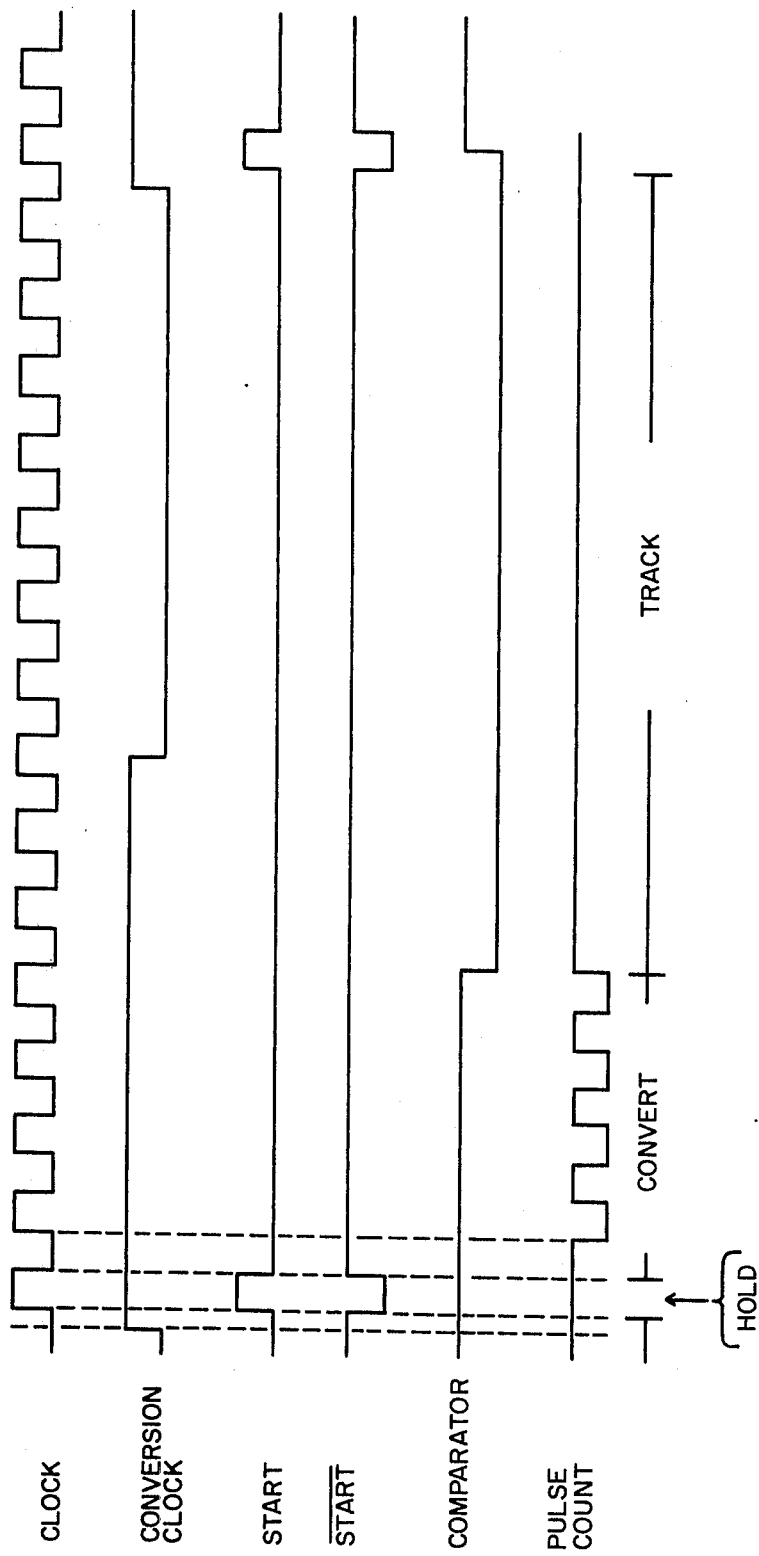
FIG. 5 is a timing diagram illustrating the relationship of the timing functions which are pertinent to the conversion process.

FIG. 5 is a waveform diagram which shows diagrammatically some of the timing factors essential to the correct operation of the A/D conversion circuit arrangement. In the description of the A/D converter shown in FIG. 4, reference will be made to the particular timing signals shown in FIG. 5 without necessarily referencing that figure. However, it should be understood that clarification of a timing function will be had by reviewing the description in conjunction with both FIGS. 4 and 5.

Referring now to FIG. 4, the inputsignal is applied via lead 29 to amplifier 31. It may be recalled that in the track mode, switch 33 is closed so that the sample-hold and integrate circuit 40 follows, on a one-to-one basis, the unknown signal, $V_x(t)$, from source 1. Thus, the voltage across capacitor 37 follows the variations in amplitude of the alternating current input signal on a one-to-one basis. Further, in the track mode, switches 23 and 27 are open so that no reference potential is applied to the noninverting input of amplifier 35.

In the discussion, switches have been stated to be open or closed, as is common practice. In FIG. 4, field-effect transistors (FET's) are used in switches 23, 27, and 33,. The analogy is appropriate for switch 33; however, switches 23 and 27 operate in shunt with respect to the through-path. For these switches (23 and 27) to be closed, the FET's are not conducting, the when the FET's are conducting, the switches 23 and 27 would be open. In the following discussion, the switch will simply be stated to be open or closed, and it is to be understood that other switching arrangements could be used so long as they perform the same function as required for the state of the switch. It should also be understood that some modification of the switch control circuitry might be required for different switching arrangements.

In order to reduce acquisition time, a feedback circuit is connected between the output of amplifier 35 and the noninverting input of amplifier 31. This reduces the time for the signal voltage across capacitor 37 to settle to a value within one-half the least significant bit (LSB) of the value of the input signal, after transition from convert mode to track mode has occurred.

Clock 65, a part of logic and timing 47, is a clock which operates at the conversion rate of the analog-to-digital converter. Note from FIG. 5 that the clock pulse rate of clock 64 is considerably higher than that of conversion clock 65. The output from clock 64 is applied to the conversion clock 65 for adjusting the phase relationships between the two clocks, the pulse generator 67, and to one input of NAND gate 115. The pulse generator 67 also has an input from conversion clock 65. Note that the clock 65 may be derived from the incoming data, in which case synchronization of the conversion clock with the incoming information is assured.

Pulse generator 67 is arranged to provide a start/command signal which is an active high pulse, "START", appearing once during a conversion interval following a positive transition of the conversion clock. This is shown in FIG. 5, and the dotted lines at the left side of the figure clearly show the relationship of the clock pulses with respect to the START pulse of the pulse generator 67. When the converter changes from the "track" to "hold" mode, a sample of the input signal is retained on capacitor 37. The transition from "track mode" to "hold mode" occurs when the START pulse goes high and the $\overline{\text{START}}$ pulse goes low. This is illustrated at the left-hand side of FIG. 5 for START and $\overline{\text{START}}$ pulses as shown for the "hold" interval. It is clear that in the timing for the embodiment of the invention as shown in FIG. 5, the START pulse goes positive when the clock 64 pulse goes positive following the positive transition of the conversion clock. When the start pulse goes positive, a START pulse output occurs during the same interval as the clock 64 pulse. Note that the pulse does not reoccur until the conversion clock again goes positive. Alternatively, the $\overline{\text{START}}$ goes negative during the same period in which the START pulse goes positive, and this occurs only once following the positive transition of the conversion clock and at the first positive edge of the clock 64. At the negative edge of the $\overline{\text{START}}$ pulse, the following events occur:

1. The contents of the counter part of 117 are read into a holding register part of 117;
2. The sign bit is read into a counting and output register as determined by comparator 43, the $\overline{Q}$ output of flip-flop 63, and logic 114;
3. Flip-flop 79, the negative zero code suppressor, is cleared;
4. The $\overline{Q}$ output of flip-flop 79 goes low which, in turn, enables the latch 113, forcing comparator 99 to the low state thus opening switch 33.

At the positive edge of the START pulse, the following events occur:

1. The counter in the counter and register 117 is cleared;
2. Flip-flop 63 goes either high or low, depending on the polarity of the sample voltage.

If the sample is positive, comparator 43 is high and flip-flop 63-Q goes high enabling gate 95; (gate 95 is now under control of flip-flop 73-Q). If the analog sample is negative, comparator 43 is low and 63-Q goes high enabling gate 93 (note: gate 93 is now under conrol of flip-flop 73-Q). The sample-hold and integrator 40, and in particular capacitor 37, "holds" a sample of the input signal for the remainder of the "HOLD mode". Transition between the HOLD and CONVERT mode is marked by the START pulse going low and the $\overline{\text{START}}$ pulse going high. At the negative edge of the START pulse flip-flop 73-Q goes high, which in turn causes the following events to occur:

1. Either gate 93 or 95 goes low, depending on the polarity of the "hold" sample. If 95 goes low (positive sample), comparator 105 goes low, closing switch 23. The positive reference voltage is applied to sample-hold and integrate circuit 40. If 93 goes low (negative sample), comparator 103 goes low, closing switch 27. The negative reference voltage is then applied to sample-hold and integrate circuit 40.
2. Gate 115 is enabled which allows clock pulses to enter the counter
3. Gate 109 is enabled and is ready to detect changes in the output of the zero-crossing detector 107. If the above steps have taken place, the counter portion of 117 counts clock pulses from clock 64 until the ramp crosses ground or an output of a portion of 117 indicates a full-count condition.

Figure 3:
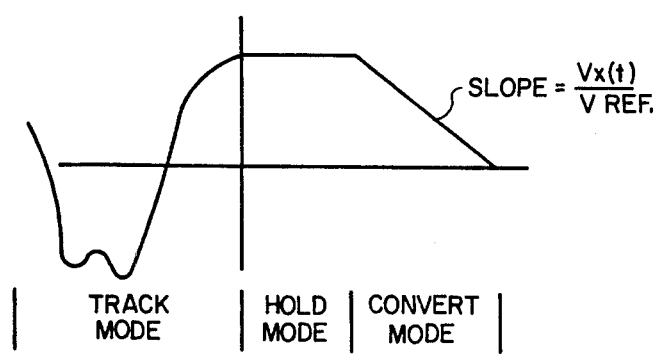

If the counter portion of 117 reaches a full count, a pulse is applied as one input to gate 111. It may be seen by following the circuit arrangement for the above conditions that during the CONVERT mode, switch 33 is open thus allowing the sample-hold and integrate circuit 40 to hold the sample on capacitor 37 for a portion of the CONVERT interval. Further, either the positive reference switch 27 or the negative reference switch 23 is closed. Under these conditions, amplifier 35 and capacitor 37, and the set of reference resistors associated with the selected reference potential form a ramp generator. The slope of the ramp is determined by the polarity of the sample voltage. If the sample is positive, operational amplifier 35 output voltage is positive, and reference switch 23 is closed. The ramp generator then consists of amplifier 35, capacitor 37, and the set of resistors connected to the positive reference potential. An additional resistor in the form of a potentiometer may be placed in series with the three resistors. The output of the integrator is a ramp of negative slope as shown in FIG. 3 for the CONVERT mode. When included in the set of reference resistors, the potentiometer is used to adjust the positive full-scale gain of the converter. When the sample is negative, amplifier 35 output voltage is negative and reference switch 27 closed (FET's turned off, switch turned on). The ramp generator consists of amplifier 35, capacitor 37, and the set of resistors connected to the negative reference potential. Again, an additional resistor in the form of a potentiometer may be placed in series with the three resistors shown. The output of the integrator is a ramp of positive slope. When included in the set of reference resistors, the potentiometer is used to adjust the negative full-scale gain of the converter.

Conversion, i.e., CONVERT mode, consists of identifying the polarity of the "hold" sample and then counting to obtain a digital representation of the magnitude of the "hold" sample. Counting begins at the positive edge of the clock pulse 64, which follows the HOLD interval and continues until the ramp voltage crosses zero or until a full count has been reached. FIG. 5 shows a count which is less than a full count. A full count would take up most of a conversion interval. The polarity, i.e. sign bit, and count are loaded into the counter portion of 117.

Once the count has been completed, transition between the CONVERT and TRACK modes occurs. It is marked by either comparator 43 changing state or by a full count. The latter is indicated by pulse information supplied via lead 119 to gate 111. When the comparator 43 changes state, a high appears at the output of Exclusive OR-gate 107 which in turn clears flip-flops 73 and 79 through the path provided by gate 109, gate 111, and the latch circuit 113. When the end of conversion is marked by a full-count condition, the output from counter and registers 117 on lead 119 is low. This supplied a low to one input of gate 111 clearing flip-flops 73 and 79, as discussed above. In either case, once flip-flops 73 and 79 are cleared, gates 115, 93, and 95 are disabled, thus blocking any more pulses from entering the counter and turning of the reference voltage source. Also, comparator 99 is driven to its high state thus closing switch 33; that is, the sample-and-hold circuit is allowed to reacquire the input signal. The converter will remain in the "track" mode until a new START pulse is received.

What has been described is, at present, considered to be the preferred embodiment of the invention. It should be understood that various modifications may be made, and it is intended to cover in the appended claims all such modifications as fall within the true spirit and scope of the invention.

What is claimed is:
1. A circuit arrangement for converting a time-varying or d-c signal into a digital representation which comprises:
   timing means;
   logic means;
   first switching means;
   reference voltage means comprising:
   a full-wave rectifier connected to receive the analog signal; and
   a low pass filter connected to the output of the full-wave rectifier to reduce the ripple and harmonic voltages generated during rectification; and means for connecting the reference voltage output from said filter means to said first switching means;
   means for generating a ramp signal comprising:
   combined sampling, holding and integrating means for timed selection of samples of said signal at intervals set by said timing means, said logic means controlling the connection of said reference voltage via said first switching means to said combined sampling, holding and integrating means; said generating means further comprising:
   a first operational amplifier having an inverting input connected to receive the signal, a non-inverting input, and an output;
   second switching means having one end connected to the output of said first operational amplifier; and
   a second operational amplifier having an inverting input connected to the other end of said first and second switching means; having a non-inverting input connected to ground, and having a capacitor connected between the inverting input and the output; and a feedback means connected between the output of said operational amplifier and the non-inverting input of said first operational amplifier;
   means for comparing said ramp signal to ground; and
   means for counting the time duration of the ramp signal for durations less than a predetermined period.
2. The connecting means of claim 1 further comprising:
   means for inverting the reference voltage output from said lowpass filter
   means for interconnecting the output of said lowpass filter and said first switching means; and
   means for interconnecting the output of said inverting means and said first switching means.

* * * * *